United States Patent
Chen

(10) Patent No.: US 10,545,358 B2
(45) Date of Patent: Jan. 28, 2020

(54) ALIGNMENT DETECTION METHOD AND DISPLAY DEVICE

(71) Applicants: BOE TECHNOLOGY GROUP CO., LTD., Beijing (CN); FUZHOU BOE OPTOELECTRONICS TECHNOLOGY CO., LTD., Fujian (CN)

(72) Inventor: Yunjin Chen, Beijing (CN)

(73) Assignees: BOE TECHNOLOGY GROUP CO., LTD., Beijing (CN); FUZHOU BOE OPTOELECTRONICS TECHNOLOGY CO., LTD., Fuzhou, Fujian (CN)

( * ) Notice: Subject to any disclaimer, the term of this patent is extended or adjusted under 35 U.S.C. 154(b) by 0 days.

(21) Appl. No.: 16/190,677

(22) Filed: Nov. 14, 2018

(65) Prior Publication Data
US 2019/0235288 A1   Aug. 1, 2019

(30) Foreign Application Priority Data
Jan. 26, 2018  (CN) .......................... 2018 1 0076250

(51) Int. Cl.
| | | |
|---|---|---|
| *H01L 23/544* | (2006.01) | |
| *G02F 1/1333* | (2006.01) | |
| *G02F 1/1368* | (2006.01) | |
| *G02F 1/1339* | (2006.01) | |
| *H01L 27/12* | (2006.01) | |
| *H01L 21/66* | (2006.01) | |
| *H01L 27/32* | (2006.01) | |

(52) U.S. Cl.
CPC .......... *G02F 1/1333* (2013.01); *G02F 1/1368* (2013.01); *G02F 1/13394* (2013.01); *H01L 22/30* (2013.01); *H01L 23/544* (2013.01); *H01L 27/1214* (2013.01); *H01L 27/3251* (2013.01); *G02F 2001/133354* (2013.01); *H01L 2223/5442* (2013.01); *H01L 2223/54426* (2013.01)

(58) Field of Classification Search
CPC .......................... H01L 27/30; H01L 27/3286; H01L 2223/544
See application file for complete search history.

(56) References Cited

U.S. PATENT DOCUMENTS

2018/0203164 A1*  7/2018  Yamamoto ....... B29D 11/00307

* cited by examiner

*Primary Examiner* — Cheung Lee
(74) *Attorney, Agent, or Firm* — Brooks Kushman P.C.

(57) ABSTRACT

An alignment detection method includes: establishing a coordinate system; providing at least one group of a first and second mark regions arranged on a first and second substrates respectively, the first and second mark regions being arranged opposite to each other so as to form at least two groups of first and second alignment marks; detecting an overlap level between an orthogonal projection of each of the first alignment marks onto the first substrate and that of the second alignment marks onto the second substrate, selecting a group of the first and second alignment marks having the highest overlap level, and acquiring, in the coordinate system, coordinate values of the first and second alignment marks in the group having the highest overlap level; and comparing the coordinate values with a threshold, so as to determine alignment accuracy between the first and second substrates.

17 Claims, 4 Drawing Sheets

ALIGNMENT DETECTION METHOD AND DISPLAY DEVICE

CROSS-REFERENCE TO RELATED APPLICATION

This application claims priority to Chinese Patent Application No. 201810076250.1 filed on Jan. 26, 2018, which is incorporated herein by reference in its entirety.

TECHNICAL FIELD

The present disclosure relates to the field of position measurement technology, in particular to an alignment detection method and a display device.

BACKGROUND

For a thin film transistor (TFT) liquid crystal display (LCD), as a high-precision electronic device, defects may occur due to any tiny error. Usually, a TFT-LCD panel includes two substrates arranged opposite to each other to form a cell, i.e., a TFT substrate and a color filter (CF) substrate. A display effect of the TFT-LCD directly depends on an alignment level of the two substrates. When there is a relatively large alignment error, i.e., there is a relatively large offset between the two substrates in each of an X direction and a Y direction, such quality problems as light leakage and display abnormality may occur. Hence, it is necessary to introduce an alignment mark, so as to determine the alignment level of the TFT substrate and the CF substrate.

SUMMARY

In one aspect, the present disclosure provides in some embodiments an alignment detection method for the alignment between a first substrate and a second substrate superimposed one on another, including: establishing a coordinate system; providing at least one group of a first mark region and a second mark region arranged on the first substrate and the second substrate respectively and opposite to each other, a plurality of first alignment marks being arranged at the first mark region and spaced apart from each other, a plurality of second alignment marks being arranged at the second mark region and spaced apart from each other, a distance between two adjacent first alignment marks being different from a distance between two adjacent second alignment marks, the first mark region and the second mark region being arranged opposite to each other so as to form at least two groups of first alignment marks and second alignment marks arranged opposite to each other; detecting an overlap level between an orthogonal projection of each of the first alignment marks onto the first substrate and an orthogonal projection of a corresponding one of the second alignment marks onto the second substrate, selecting a group of the first alignment mark and the second alignment mark having the highest overlap level, and acquiring, in the coordinate system, coordinate values of each of the first alignment mark and the second alignment mark in the group having the highest overlap level; and comparing the coordinate values of each of the first alignment mark and the second alignment mark with a threshold, so as to determine alignment accuracy between the first substrate and the second substrate.

In a possible embodiment of the present disclosure, the alignment detection method further includes determining an offset direction and/or an offset direction of the alignment of the first substrate and the second substrate in accordance with a result acquired after comparing the coordinate values with the threshold, and adjusting the alignment of the first substrate and the second substrate in accordance with the offset direction and/or the offset distance.

In a possible embodiment of the present disclosure, the selecting the group of the first alignment mark and the second alignment mark having the highest overlap level includes detecting, by an optical detector, a grayscale value of an overlapping portion between the orthogonal projection of each first alignment mark onto the first substrate and the orthogonal projection of the corresponding second alignment mark onto the second substrate, obtaining a plurality of grayscale values, comparing the plurality of grayscale values with each other, and selecting a group of the first alignment mark and the second alignment mark having the greatest grayscale value as the group of the first alignment mark and the second alignment mark having the highest overlap level.

In a possible embodiment of the present disclosure, the establishing the coordinate system includes establishing a planar coordinate system including an x-axis direction and a y-axis direction on the first substrate or the second substrate, or on the first mark region or the second mark region.

In a possible embodiment of the present disclosure, the distance between the two adjacent first alignment marks at the first mark region is different from the distance between the two adjacent second alignment marks at the second mark region.

In a possible embodiment of the present disclosure, the threshold is an acceptable range of an alignment error for the first substrate and the second substrate. The threshold is acquired through: testing central values (X, Y), the central values being coordinate values of each of the first alignment mark and the second alignment mark in the group having the highest overlap level when there is no alignment error for the first substrate and the second substrate; testing a fluctuation value, the fluctuation value being a difference between each central value and the coordinate values of each of the first alignment mark and the second alignment mark in the group having the highest overlap level when product quality is not adversely affected by the alignment error for the first substrate and the second substrate, the fluctuation value being acquired through selecting a plurality of first substrates and second substrates for which the alignment errors are within the acceptable range, determining the coordinate values of each of the first alignment marks and the second alignment marks in a plurality of groups having the highest overlap level, selecting a maximum one and a minimum one of the coordinate values of each of the first alignment marks and the second alignment marks and acquiring a difference between the corresponding central value and each of the maximum value and the minimum value, the fluctuation value in the X-axis direction being (X-b, X+a), the fluctuation value in the Y-axis direction being (Y−c, Y+d); and acquiring the threshold u=(ux,uy), and determining whether the coordinate values of each of the first alignment mark and the second alignment mark in the group having the highest overlap level are within the range of u=(ux,uy) so as to determine the alignment accuracy between the first substrate and the second substrate, where ux=[X−b, X+a], uy=[Y−c, Y+d].

In a possible embodiment of the present disclosure, the group of the first alignment mark and the second alignment mark having the greatest grayscale value at least meets a condition where a difference between a grayscale value of the group having the greatest grayscale value and a grayscale value of either of two adjacent groups of first alignment marks and second alignment marks is greater than 0.

In a possible embodiment of the present disclosure, when there is a plurality of groups of first alignment marks and second alignment marks which at least meets the condition where the difference between a grayscale value of each of the groups and a grayscale value of either of two adjacent groups of first alignment marks and second alignment marks is greater than 0, a group of the first alignment mark and the second alignment mark, coordinate values of each of which are closest to the corresponding central values, is selected as the group of the first alignment mark and the second alignment mark having the greatest grayscale value for the first substrate and the second substrate.

In another aspect, the present disclosure provides in some embodiments a display device, including a first substrate and a second substrate superimposed one on another. A first mark region is arranged on the first substrate, and a second mark region is arranged opposite to the first mark region on the second substrate. A plurality of first alignment marks is arranged at the first mark region and spaced apart from each other, a plurality of second alignment marks is arranged at the second mark region and spaced apart from each other, and a distance between two adjacent first alignment marks is different from a distance between two adjacent second alignment marks. The first mark region and the second mark region are arranged opposite to each other so as to form at least two groups of first alignment marks and second alignment marks arranged opposite to each other.

In a possible embodiment of the present disclosure, each first alignment mark is a light-transmission region, and each second alignment mark is an alignment post.

In a possible embodiment of the present disclosure, an orthogonal projection of each first alignment mark onto the display device has a same shape and a same area as an orthogonal projection of each second alignment mark onto the display device.

In a possible embodiment of the present disclosure, the first substrate is a TFT substrate, a gate electrode layer and a source-drain electrode layer are arranged on the first substrate, and each first alignment mark is arranged on the gate electrode layer or the source-drain electrode layer.

In a possible embodiment of the present disclosure, at least 81 first alignment marks and at least 81 second alignment marks are arranged at the first mark region and the second mark region respectively.

In a possible embodiment of the present disclosure, the distance between the two adjacent second alignment marks is 10 to 100 times of the distance between the two adjacent first alignment marks.

In a possible embodiment of the present disclosure, each of the first substrate and the second substrate is of a rectangular shape, the first mark region is arranged at each corner portion of the first substrate, and the second mark region is arranged at each corner portion of the second substrate.

In a possible embodiment of the present disclosure, the display device further includes a spacer arranged between the first substrate and the second substrate, and each second alignment mark is made of a same material as the spacer through a same patterning process.

In a possible embodiment of the present disclosure, the light-transmission region is a light-transmission coating, a via-hole or a transparent region.

BRIEF DESCRIPTION OF THE DRAWINGS

The following drawings are provided to facilitate the understanding of the present disclosure, and constitute a portion of the description. These drawings and the following embodiments are for illustrative purposes only, but shall not be construed as limiting the present disclosure.

DETAILED DESCRIPTION

In order to make the objects, the technical solutions and the advantages of the present disclosure more apparent, the present disclosure will be described hereinafter in a clear and complete manner in conjunction with the drawings and embodiments. It should be appreciated that, the embodiments and the features in the embodiments may be combined in any form, in the case of no conflict.

The present disclosure provides in some embodiments an alignment detection method for the alignment of a first substrate and a second substrate superimposed one on another. The alignment detection method includes: 1) establishing a coordinate system; 2) providing at least one group of a first mark region and a second mark region arranged on the first substrate and the second substrate respectively and opposite to each other, a plurality of first alignment marks being arranged at the first mark region and spaced apart from each other, a plurality of second alignment marks being arranged at the second mark region and spaced apart from each other, a distance between two adjacent first alignment marks being different from a distance between two adjacent second alignment marks, the first mark region and the second mark region being arranged opposite to each other so as to form at least two groups of first alignment marks and second alignment marks arranged opposite to each other; 3) detecting an overlap level between an orthogonal projection of each of the first alignment marks onto the first substrate and an orthogonal projection of a corresponding one of the second alignment marks onto the second substrate, selecting a group of the first alignment mark and the second alignment mark having the highest overlap level, and acquiring, in the coordinate system, coordinate values of each of the first alignment mark and the second alignment mark in the group having the highest overlap level; and 4) comparing the coordinate values of each of the first alignment mark and the second alignment mark with a threshold, so as to determine alignment accuracy between the first substrate and the second substrate.

Figure 1:
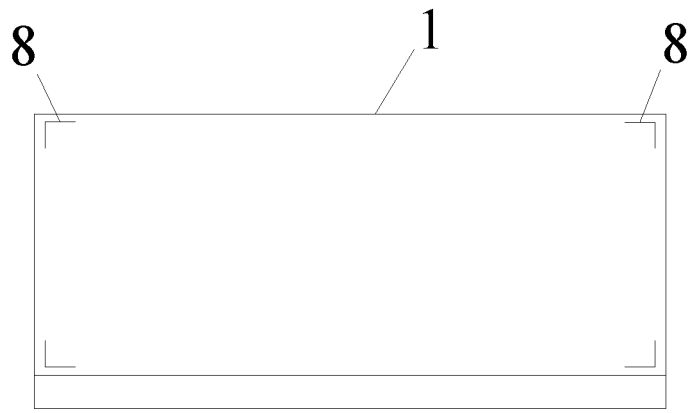
FIG. 1 is a schematic view showing a panel in a related art.

Currently, an alignment level of substrates is detected through alignment marks of a vernier caliper type. As shown in FIG. 1, eight alignment marks 8 are arranged at four corner portions of a panel 1 in both a horizontal direction and a vertical direction. At each corner portion, the alignment marks 8 in the horizontal direction and the vertical direction are perpendicular to each other, so as to determine an offset of each corner portion in an x-axis direction and a y-axis direction. Among scale marks at two sides a certain alignment mark 8 on each of a TFT substrate and a CF substrate, the scale marks having the highest overlap level may be determined, so as to determine an offset at the corner portion, thereby to determine the alignment level. These alignment marks 8 are designed depending on a principle of a vernier caliper, and a tiny alignment offset is determined in accordance with a difference between a scale spacing of a main scale, i.e., a scale on the TFT substrate, and a scale spacing of a vernier scale, i.e., a scale on the CF substrate. However, there exist the following defects. (1) A segment difference is set inappropriately, so there may exist a plurality of pairs of scale marks each having a high overlap level, and thereby it is difficult to determine the offset. (2) When the offset is relatively large, there may be no scale marks overlapping each other, so it is difficult to determine the offset. (3) It is necessary to provide a large amount of alignment marks, so as to reflect the offset of the panel in the x-axis direction or the y-axis direction. (4) It is impossible to determine the offset automatically (i.e., it is necessary to determine the offset by a person), so it is adverse to the automated production and thereby the alignment error may easily occur.

Figure 2:
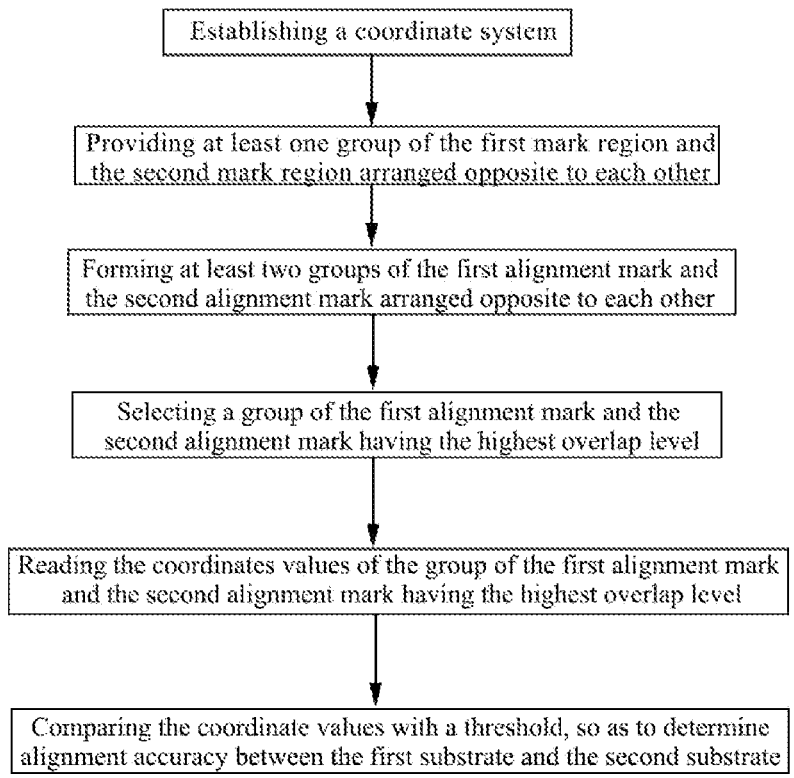
FIG. 2 is a flow chart of an alignment detection method according to at least one embodiment of the present disclosure.

As shown in FIG. 2, the present disclosure provides in some embodiments an alignment detection method for the alignment of a first substrate 2 and a second substrate 3. The first substrate 2 is a TFT substrate, and the second substrate 3 is a CF substrate. The alignment detection method includes the following steps.

Step 1: establishing a coordinate system. To be specific, a planar coordinate system having an x-axis direction and a y-axis direction may be established on the first substrate 2 or the second substrate 3. In the embodiments of the present disclosure, the coordinate system may also be established in any other ways. For example, the coordinate system may be established on a first mark region 5 or a first mark region 7 which will be described hereinafter. In addition, the coordinate system may also be established on an uncut substrate. A plurality of first substrates 2 or second substrates 3 may be arranged on the uncut substrate, and the coordinate system may be established on the uncut substrate in accordance with the distribution of the first substrates 2 or the second substrates 3 on the uncut substrate.

Step 2: providing at least one group of the first mark region 5 and the second mark region 7 arranged opposite to each other on the first substrate 2 and the second substrate 3 respectively. A plurality of first alignment marks 4 may be arranged at the first mark region 5 and spaced apart from each other, and a plurality of second alignment marks 6 may be arranged at the second mark region 7 and spaced apart from each other. After the first substrate 2 is arranged opposite to the second substrate 3, the first mark region 5 on the first substrate 2 may be arranged opposite to the second mark region 7 on the second substrate 3, so as to form at least two groups of first alignment marks 4 and second alignment marks 6 arranged opposite to each other.

A distance between two adjacent first alignment marks 4 at the first mark region 5 is different from a distance between two adjacent second alignment marks 6. In some possible embodiments of the present disclosure, the distance between the two adjacent second alignment marks 6 may be 10 to 100 times, e.g., 10 times, 20 times or 50 times, of the distance between the two adjacent first alignment marks 4, so as to provide a certain segment difference between the first alignment mark 4 and the corresponding second alignment mark 6. When the first substrate 2 is arranged opposite to the second substrate 3 to form a cell, the first alignment marks 4 may overlap the second alignment marks 5 at different overlap levels, so as to form a structure similar to a vernier caliper. At this time, the distance between the two adjacent second alignment marks 6 is similar to a main scale of the vernier caliper, and the distance between the two adjacent first alignment marks 6 is similar to a vernier scale of the vernier caliper, so as to improve the alignment detection accuracy.

Figure 3:
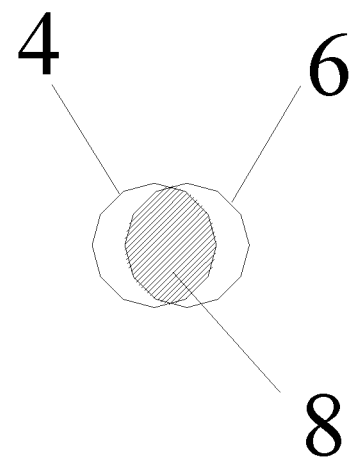
FIG. 3 is a schematic view showing a situation where a first alignment mark overlaps a second alignment mark according to at least one embodiment of the present disclosure.

Step 3: detecting an overlap level between an orthogonal projection of each of the first alignment marks 4 onto the first substrate 2 and an orthogonal projection of a corresponding one of the second alignment marks 6 onto the second substrate 3. To be specific as shown in FIG. 3, the first mark region 5 and the second mark region 7 may be arranged opposite to each other so that the orthogonal projection of each first alignment mark 4 onto the first substrate 2 overlaps the orthogonal projection of the corresponding second alignment mark 6 onto the second substrate 3. A detection light beam may be emitted vertically downward by an optical detector, and then a grayscale value of an overlapping portion 8 between the orthogonal projection of each first alignment mark 4 onto the first substrate 2 and the orthogonal projection of the corresponding second alignment mark 6 onto the second substrate 3 is acquired. The acquired grayscale values may be compared with each other, and then a group of the first alignment mark 4 and the second alignment mark 6 having the greatest grayscale value may be selected as a group of the first alignment mark 4 and the second alignment mark 6 having the highest overlap level. The optical detector may be an Automated Optical Inspection (AOI) device, a grayscale detector or any other appropriate optical detector.

Step 4: acquiring, in the coordinate system, coordinate values (x1,y1) of the first alignment mark 4 and coordinate values (x2,y2) of the second alignment mark 6 in the group having the highest overlap level, and comparing the coordinate values of each of the first alignment mark 4 and the second alignment mark 6 with a threshold u, so as to determine alignment accuracy between the first substrate 2 and the second substrate 3.

The threshold u may be an acceptable range of the alignment error for the first substrate 2 and the second substrate 3, i.e., when the alignment error for the first substrate 2 and the second substrate 3 is within the acceptable range, the product quality may not be adversely affected. The threshold u may be acquired through the following steps.

First step: testing central values (X, Y). The central values refer to coordinate values of each of the first alignment mark 4 and the second alignment mark 6 in the group having the highest overlap level when there is no alignment error for the first substrate 2 and the second substrate 3.

Second step: testing a fluctuation value. The fluctuation value refers to a difference between each central value and the coordinate values of each of the first alignment mark 4 and the second alignment mark 6 in the group having the highest overlap level when product quality is not adversely affected by the alignment error for the first substrate 2 and the second substrate 3. To be specific, a plurality of first substrates 2 and second substrates 3 for which the alignment errors are within the acceptable range, the coordinate values of each of the first alignment marks 4 and the second alignment marks 6 in a plurality of groups having the highest overlap level may be acquired through the abovementioned Step 3, a maximum one and a minimum one of the coordinate values of each of the first alignment marks and the second alignment marks may be acquired, and then a difference between the corresponding central value and each of the maximum value and the minimum value may be determined so as to acquire the fluctuation value. For example, for the central value (X, Y), the fluctuation value in the X-axis direction may be (X−b, X+a), the fluctuation value in the Y-axis direction may be (Y−c, Y+d).

Third step: acquiring the threshold u=(ux,uy), and determining whether the coordinate values of each of the first alignment mark 4 and the second alignment mark 6 in the group having the highest overlap level are within the range of u=(ux,uy) so as to determine the alignment accuracy between the first substrate 2 and the second substrate 3, where ux=[X−b, X+a], uy=[Y−c, Y+d]. When the coordinate values are not within the range, it is necessary to align the substrates.

Figure 4:
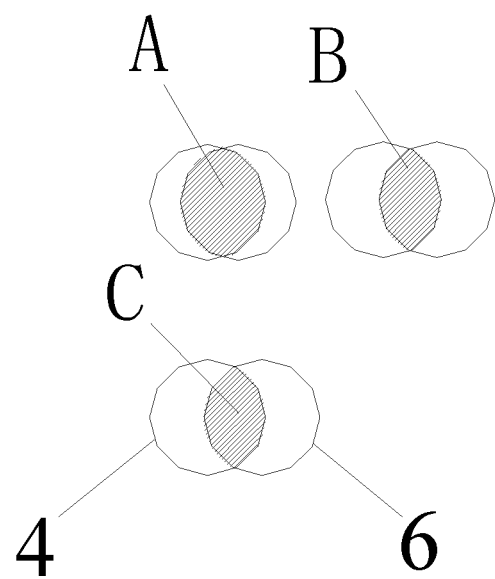
FIG. 4 is a schematic view showing a pair of the first alignment mark and the second alignment mark having the highest overlap level according to at least one embodiment of the present disclosure.

The group of the first alignment mark 4 and the second alignment mark 6 having the greatest grayscale value may be selected as follows. As shown in FIG. 4, A, B and C are each an overlapping portion of a group of the first alignment mark 4 and the second alignment mark 6 arranged opposite to each other on the first substrate 2 and the second substrate 3. A difference between a grayscale value of A and each of grayscale values of B and C adjacent to A needs to be greater than 0, i.e., when the grayscale value of A is greater than the grayscale value of B and the grayscale value of A is greater than the grayscale value of C, A may be just the overlapping region of the group of the first alignment mark 4 and the second alignment mark 6 having the greatest grayscale value. The group of the first alignment mark 4 and the second alignment mark 6 having the greatest grayscale value needs to at least meet a condition where the difference between the grayscale value of the group having the greatest grayscale value and the grayscale value of either of the two adjacent groups of first alignment marks 4 and second alignment marks 6 is greater than 0. When there is a plurality of groups of first alignment marks 4 and second alignment marks 6 for the first substrate 2 and the second substrate 3 which meets the above condition, a group of the first alignment mark 4 and the second alignment mark 6, coordinate values of each of which are closest to the corresponding central values (X, Y), may be selected as the group of the first alignment mark 4 and the second alignment mark 6 having the greatest grayscale value for the first substrate 2 and the second substrate 3. In some possible embodiments of the present disclosure, the group of the first alignment mark 4 and the second alignment mark 6 having the greatest grayscale value needs to at least meet a condition where a difference between the grayscale value of the group having the greatest grayscale value and the grayscale value of any of all the adjacent groups of first alignment marks 4 and second alignment marks 6 is greater than 0.

According to the embodiments of the present disclosure, the alignment detection method may be adopted in combination with the optical detector, so as to automatically determine the alignment accuracy of the first substrate 2 and the second substrate 3 in the production line. In addition, the coordinate values of the group of the first alignment mark and the second alignment mark having the highest overlap level are compared with the threshold, so as to directly determine whether the alignment accuracy of the first substrate 2 and the second substrate 3 meets the requirement. As a result, it is able to reduce the tact time as well as labor cost.

In a possible embodiment of the present disclosure, the alignment detection method further includes directly determining an offset direction and an offset distance for the alignment of the first substrate 2 and the second substrate 3 in accordance with a comparison result acquired after comparing the coordinate values of each of the first alignment mark 3 and the second alignment mark 6 in the group having the highest overlap level with the threshold. When the coordinate values are not within the range of the threshold, it means that the alignment accuracy has not been met yet. At this time, an operator may adjust the alignment between the first substrate 2 and the second substrate 3 in accordance with the offset direction and the offset distance, so that the alignment accuracy between the first substrate 2 and the second substrate 3 meets the requirement.

Figure 5:
FIG. 5 is a schematic view showing a display device according to at least one embodiment of the present disclosure.

As shown in FIG. 5, the present disclosure further provides in some embodiments a display device which includes a first substrate 2 and a second substrate 3 superimposed one on another. A first mark region 5 is arranged on the first substrate 2, and a second mark region 7 is arranged on the second substrate 3. A plurality of first alignment marks 4 is arranged at the first mark region 5 and spaced apart from each other, a plurality of second alignment marks 6 is arranged at the second mark region 7 and spaced apart from each other. After the first substrate 2 and the second substrate 3 are arranged opposite to each other, the first mark region 5 on the first substrate 2 is arranged opposite to the second mark region 7 on the second substrate 3, so as to form at least two groups of first alignment marks 4 and second alignment marks 6 arranged opposite to each other. The display device may be any product or member having a display function, e.g., a liquid crystal display panel, an electronic paper, an organic light-emitting diode (OLED) panel, a mobile phone, a flat-panel computer, a television, a display, a laptop computer, a digital photo frame or a navigator.

In a possible embodiment of the present disclosure, the display device may be an LCD panel, and it may further include a spacer arranged between the first substrate 2 and the second substrate 3. Each second alignment mark 6 is made of a same material as the spacer through a same patterning process. The patterning process may be a masking process including a photoresist coating, exposure, developing, etching and removal of the photoresist, or a printing process. When the second alignment marks 6 and the spacer are formed through the same patterning process, it is able to simplify the manufacture process.

In a possible embodiment of the present disclosure, a distance between two adjacent first alignment marks 4 at the first mark region 5 is different from a distance between two adjacent second alignment marks 6. To be specific, the distance between the two adjacent second alignment marks 6 may be 10 to 100 times, e.g., 10 times, 20 times or 50 times, of the distance between the two adjacent first alignment marks 4, so as to provide a certain segment difference between the first alignment mark 4 and the corresponding second alignment mark 6. When the first substrate 2 is arranged opposite to the second substrate 3 to form a cell, the first alignment marks 4 may overlap the second alignment marks 5 at different overlap levels, so as to form a structure similar to a vernier caliper. At this time, the distance between the two adjacent second alignment marks 6 is similar to a main scale of the vernier caliper, and the distance between the two adjacent first alignment marks 6 is similar to a vernier scale of the vernier caliper, so as to improve the alignment detection accuracy.

Figure 6:
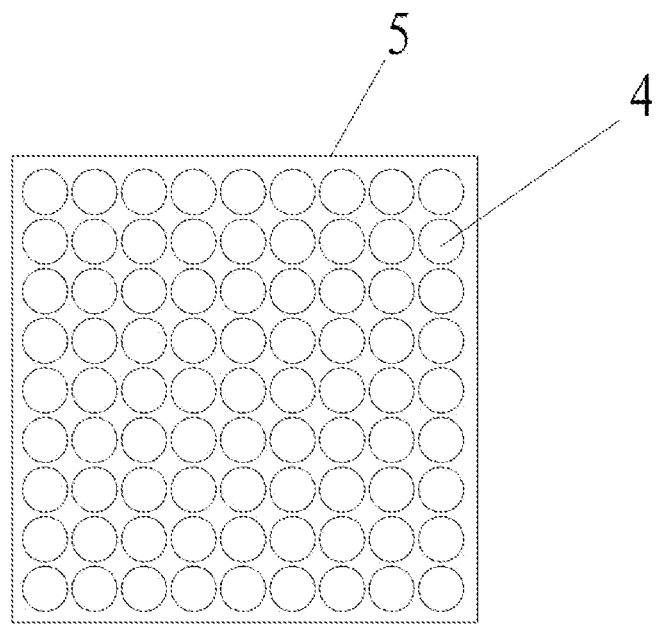
FIG. 6 is a schematic view showing a first mark region according to at least one embodiment of the present disclosure.
Figure 7:
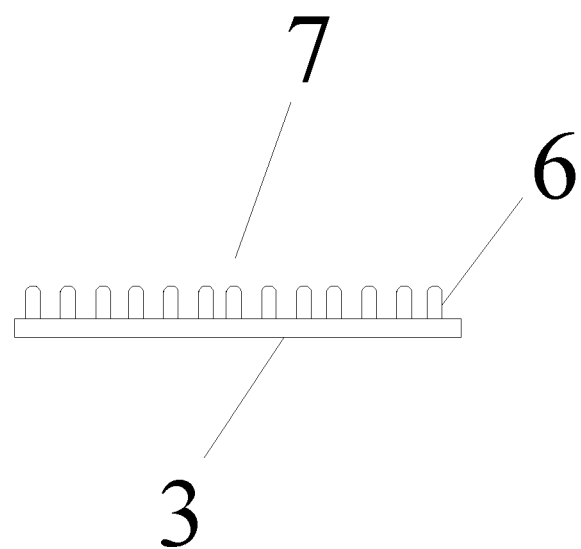
FIG. 7 is a side view of a second mark region according to at least one embodiment of the present disclosure.

As shown in FIGS. 6 and 7, each first alignment mark 4 is a light-transmission region, and each second alignment mark 6 is an alignment post. An orthogonal projection of the light-transmission region onto the display device has a same shape and a same area as an orthogonal projection of the corresponding alignment post onto the display device. For example, each first alignment mark 4 may be a circular transparent region, and the corresponding second alignment mark 6 may be a post spacer (PS). In a possible embodiment of the present disclosure, each first alignment mark 4 may also be a transparent region of any other shape, e.g., a rectangular shape or an elliptical shape. The light-transmission region refers to a region through which a light beam is to pass, e.g., a light-transmission coating, a via-hole or a transparent region.

In a possible embodiment of the present disclosure, the first substrate 2 is a TFT substrate; a gate electrode layer and a source-drain electrode layer are arranged on the first substrate 2, and the first alignment marks 4 are arranged on the gate electrode layer or the source-drain electrode layer. In this way, it is able to facilitate the formation of the first alignment marks 4 on the first substrate 2 through machining. The second substrate 3 is a CF substrate.

As shown in FIGS. 6 and 7, the first alignment marks 4 and the second alignment marks 6 are arranged at regular intervals so as to form the rectangular first mark region 5 and the rectangular second mark region 7 respectively. To be specific, the plurality of first alignment marks 4 and the plurality of second alignment marks 6 are arranged at regular intervals so as to together form a rectangular region including the first mark region 5 and the second mark region 7. In a possible embodiment of the present disclosure, at least 81 first alignment marks 4 are arranged at the first mark region 5, and at least 81 second alignment marks 6 are arranged at the second mark region 7. At this time, when the first mark region 5 is arranged opposite to the second mark region 7, a certain amount of the first alignment marks 4 may each be arranged opposite to the corresponding second alignment mark 6, and then a group of the first alignment mark 4 and the second alignment mark 6 having the highest overlap level may be selected from the certain amount of groups of first alignment marks 4 and second alignment marks 6 arranged opposite to each other. Then, the alignment level of the display device may be determined in accordance with coordinate values of each of the first alignment mark 4 and the second alignment mark 6 in the group having the highest overlap level, so as to improve the alignment accuracy. In a possible embodiment of the present disclosure, the first mark region 5 may be a 0.8 mm*0.8 mm rectangular region.

As shown in FIG. 5, the first substrate 2 and the second substrate 3 may each be of a rectangular shape, the rectangular first mark region 5 may be arranged at each corner portion of the first substrate 2, and the rectangular second mark region 7 may be arranged at each corner portion of the second substrate 3. On one hand, each second alignment mark 6 is an alignment post, so it is able to enhance an impact resistance capability of each corner portion of the second substrate 3 when the second alignment marks 6 are arranged at the corner portion, thereby to improve the mechanical strength of the second substrate 3. On the other hand, it is able to improve a spatial utilization rate of each of the first substrate 2 and the second substrate 3. In a possible embodiment of the present disclosure, the first mark region 5 may be arranged at one, two or three corner portions of the first substrate 2, or any other positions on the first substrate 2, and correspondingly the second mark region 7 may be arranged at one, two or three corner portions of the second substrate 3, or any other positions on the second substrate 3, which will not be particularly defined herein.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An alignment detection method for the alignment between a first substrate and a second substrate superimposed one on another, comprising:
   establishing a coordinate system;
   providing at least one group of a first mark region and a second mark region arranged on the first substrate and the second substrate respectively and opposite to each other, a plurality of first alignment marks being arranged at the first mark region and spaced apart from each other, a plurality of second alignment marks being arranged at the second mark region and spaced apart from each other, a distance between two adjacent first alignment marks being different from a distance between two adjacent second alignment marks, the first mark region and the second mark region being arranged opposite to each other to form at least two groups of first alignment marks and second alignment marks arranged opposite to each other;
   detecting an overlap level between an orthogonal projection of each of the first alignment marks onto the first substrate and an orthogonal projection of a corresponding one of the second alignment marks onto the second substrate, selecting a group of the first alignment mark and the second alignment mark having the highest overlap level, and acquiring, in the coordinate system, coordinate values of each of the first alignment mark and the second alignment mark in the group having the highest overlap level; and
   comparing the coordinate values of each of the first alignment mark and the second alignment mark with a threshold, to determine alignment accuracy between the first substrate and the second substrate.

2. The alignment detection method according to claim 1, further comprising determining an offset direction and/or an offset direction of the alignment of the first substrate and the second substrate in accordance with a result acquired after comparing the coordinate values with the threshold, and adjusting the alignment of the first substrate and the second substrate in accordance with the offset direction and/or the offset distance.

3. The alignment detection method according to claim 1, wherein the selecting the group of the first alignment mark and the second alignment mark having the highest overlap level comprises detecting, by an optical detector, a grayscale value of an overlapping portion between the orthogonal projection of each first alignment mark onto the first substrate and the orthogonal projection of the corresponding second alignment mark onto the second substrate, obtaining a plurality of grayscale values, comparing the plurality of grayscale values with each other, and selecting a group of the first alignment mark and the second alignment mark having the greatest grayscale value as the group of the first alignment mark and the second alignment mark having the highest overlap level.

4. The alignment detection method according to claim 3, wherein the group of the first alignment mark and the second alignment mark having the greatest grayscale value at least meets a condition where a difference between a grayscale value of the group having the greatest grayscale value and a grayscale value of either of two adjacent groups of first alignment marks and second alignment marks is greater than 0.

5. The alignment detection method according to claim 4, wherein when there is a plurality of groups of first alignment marks and second alignment marks which at least meets the condition where the difference between a grayscale value of each of the groups and a grayscale value of either of two adjacent groups of first alignment marks and second alignment marks is greater than 0, a group of the first alignment mark and the second alignment mark, coordinate values of each of which are closest to the corresponding central values, is selected as the group of the first alignment mark and the second alignment mark having the greatest grayscale value for the first substrate and the second substrate.

6. The alignment detection method according to claim 1, wherein the establishing the coordinate system comprises establishing a planar coordinate system comprising an x-axis direction and a y-axis direction on the first substrate or the second substrate, or on the first mark region or the second mark region.

7. The alignment detection method according to claim 1, wherein the distance between the two adjacent first alignment marks at the first mark region is different from the distance between the two adjacent second alignment marks at the second mark region.

8. The alignment detection method according to claim 1, wherein the threshold is an acceptable range of an alignment error for the first substrate and the second substrate,
wherein the threshold is acquired through:
testing central values (X, Y), the central values being coordinate values of each of the first alignment mark and the second alignment mark in the group having the highest overlap level when there is no alignment error for the first substrate and the second substrate;
testing a fluctuation value, the fluctuation value being a difference between each central value and the coordinate values of each of the first alignment mark and the second alignment mark in the group having the highest overlap level when product quality is not adversely affected by the alignment error for the first substrate and the second substrate, the fluctuation value being acquired through selecting a plurality of first substrates and second substrates for which the alignment errors are within the acceptable range, determining the coordinate values of each of the first alignment marks and the second alignment marks in a plurality of groups having the highest overlap level, selecting a maximum one and a minimum one of the coordinate values of each of the first alignment marks and the second alignment marks and acquiring a difference between the corresponding central value and each of the maximum value and the minimum value, the fluctuation value in the X-axis direction being (X−b, X+a), the fluctuation value in the Y-axis direction being (Y−c, Y+d); and acquiring the threshold u=(ux,uy), and determining whether the coordinate values of each of the first alignment mark and the second alignment mark in the group having the highest overlap level are within the range of u=(ux,uy) so as to determine the alignment accuracy between the first substrate and the second substrate, where ux=[X−b, X+a], uy=[Y−c, Y+d].

9. A display device, comprising a first substrate and a second substrate superimposed one on another, wherein a first mark region is arranged on the first substrate, a second mark region is arranged on the second substrate, a plurality of first alignment marks is arranged at the first mark region and spaced apart from each other, a plurality of second alignment marks is arranged at the second mark region and spaced apart from each other, a distance between two adjacent first alignment marks is different from a distance between two adjacent second alignment marks, and the first mark region and the second mark region are arranged opposite to each other so as to form at least two groups of first alignment marks and second alignment marks arranged opposite to each other.

10. The display device according to claim 9, wherein each first alignment mark is a light-transmission region, and each second alignment mark is an alignment post.

11. The display device according to claim 10, wherein an orthogonal projection of each first alignment mark onto the display device has a same shape and a same area as an orthogonal projection of each second alignment mark onto the display device.

12. The display device according to claim 10, wherein the first substrate is a thin film transistor (TFT) substrate, a gate electrode layer and a source-drain electrode layer are arranged on the first substrate, and each first alignment mark is arranged on the gate electrode layer or the source-drain electrode layer.

13. The display device according to claim 10, wherein the light-transmission region is a light-transmission coating, a via-hole or a transparent region.

14. The display device according to claim 9, wherein at least 81 first alignment marks and at least 81 second alignment marks are arranged at the first mark region and the second mark region respectively.

15. The display device according to claim 9, wherein the distance between the two adjacent second alignment marks is 10 to 100 times of the distance between the two adjacent first alignment marks.

16. The display device according to claim 9, wherein each of the first substrate and the second substrate is of a rectangular shape, the first mark region is arranged at each corner portion of the first substrate, and the second mark region is arranged at each corner portion of the second substrate.

17. The display device according to claim 9, further comprising a spacer arranged between the first substrate and the second substrate, wherein each second alignment mark is made of a same material as the spacer through a same patterning process.

* * * * *